United States Patent
Nobori et al.

(10) Patent No.: US 6,541,796 B2
(45) Date of Patent: Apr. 1, 2003

(54) OPTO-ELECTRONIC DEVICE WITH SELF-ALIGNED OHMIC CONTACT LAYER

(75) Inventors: Masaharu Nobori, Hachioji (JP); Hiroyuki Fujiwara, Hachioji (JP); Masumi Koizumi, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 09/933,341

(22) Filed: Aug. 20, 2001

(65) Prior Publication Data

US 2001/0054716 A1 Dec. 27, 2001

Related U.S. Application Data

(62) Division of application No. 09/562,340, filed on May 1, 2000, now Pat. No. 6,291,328.

(30) Foreign Application Priority Data

May 28, 1999 (JP) .......................... 11-149379

(51) Int. Cl.[7] .............................. H01L 27/15
(52) U.S. Cl. ................... 257/79; 257/102; 257/80; 257/83; 257/95; 257/99
(58) Field of Search ................ 257/102, 79, 80, 257/83, 95, 99

(56) References Cited

U.S. PATENT DOCUMENTS

| | | | | |
|---|---|---|---|---|
| 3,636,617 A | * | 1/1972 | Schmidt et al. | |
| 3,942,243 A | * | 3/1976 | Murray | |
| 4,207,586 A | * | 6/1980 | Lebailly | 136/256 |
| 4,634,474 A | * | 1/1987 | Camlibel et al. | |
| 4,875,216 A | | 10/1989 | Thornton et al. | |
| 5,031,185 A | | 7/1991 | Murakami et al. | |
| 5,144,396 A | * | 9/1992 | Sargood | |
| 5,258,631 A | | 11/1993 | Usagawa et al. | |
| 5,275,969 A | * | 1/1994 | Takahashi | |
| 5,381,027 A | | 1/1995 | Usagava et al. | |
| 5,700,714 A | * | 12/1997 | Ogihara et al. | 438/555 |
| 5,789,768 A | * | 8/1998 | Lee et al. | 257/103 |
| 5,955,747 A | * | 9/1999 | Ogihara et al. | |
| 6,063,643 A | * | 5/2000 | Dutta | 438/26 |
| 6,063,644 A | * | 5/2000 | Ogihara et al. | 257/101 |
| 6,064,418 A | * | 5/2000 | Shimizu et al. | |
| 6,136,627 A | * | 10/2000 | Ogihara et al. | |
| 6,222,208 B1 | * | 4/2001 | Ogihara et al. | |
| 6,313,483 B1 | * | 11/2001 | Ogihara et al. | |

FOREIGN PATENT DOCUMENTS

| | | |
|---|---|---|
| FR | 002725834 A1 | 4/1996 |
| JP | 06053542 * | 2/1994 |

* cited by examiner

*Primary Examiner*—Eddie Lee
*Assistant Examiner*—Eugene Lee
(74) *Attorney, Agent, or Firm*—Akin Gump Strauss Hauer & Feld, L.L.P.

(57) ABSTRACT

An opto-electronic device has a diffusion area of one conductive type formed in a semiconductor substrate of another conductive type, an ohmic contact layer making contact with the diffusion area, and an electrode making contact with the ohmic contact layer. The diffusion area is formed by solid-phase diffusion. The same mask is used to define the patterns of both the diffusion source layer and the ohmic contact layer, so that the ohmic contact layer is self-aligned with the diffusion area.

3 Claims, 14 Drawing Sheets

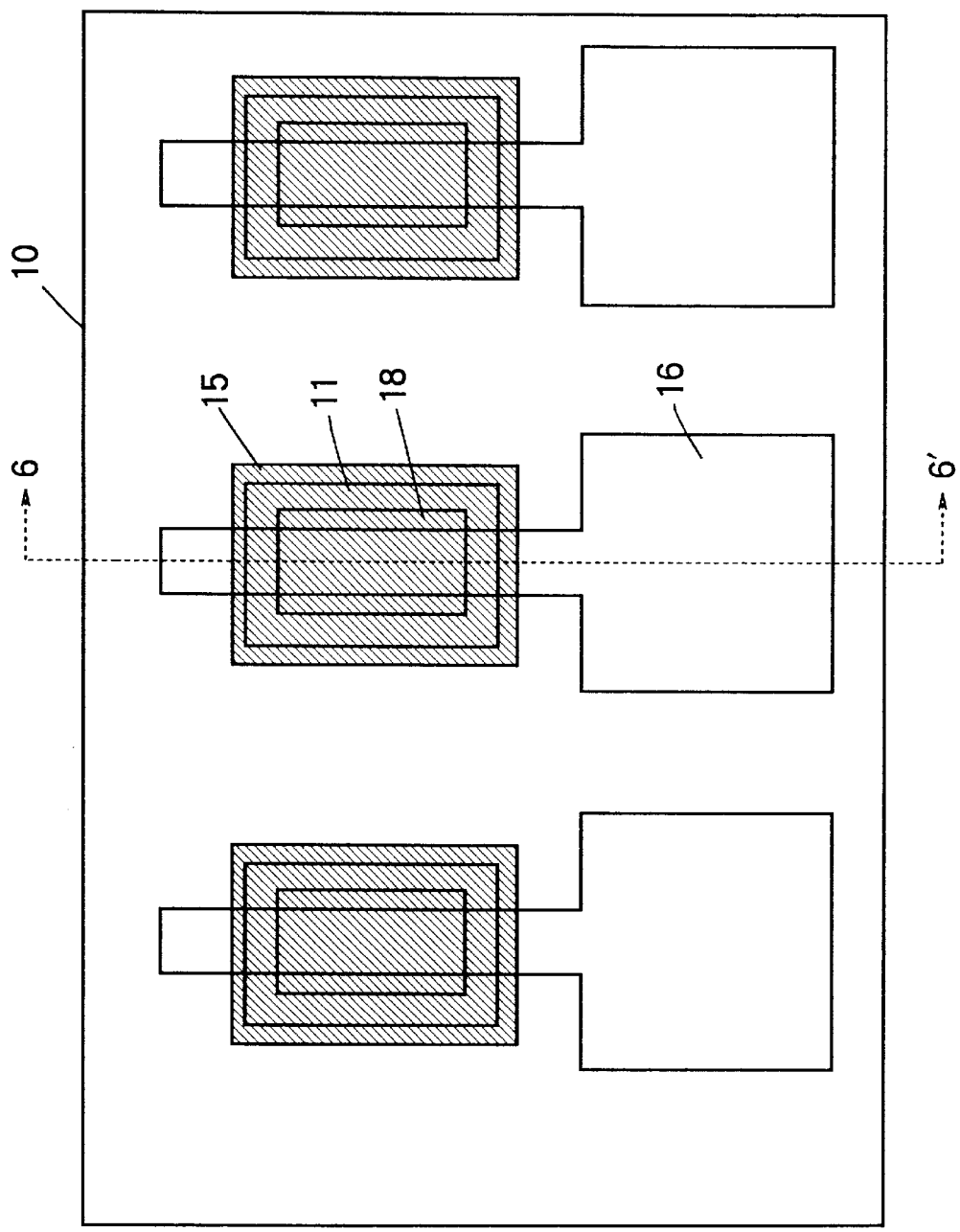

OPTO-ELECTRONIC DEVICE WITH SELF-ALIGNED OHMIC CONTACT LAYER

This is a divisional of application Ser. No. 09/562,340, filed May 1, 2000, now U.S. Pat. No. 6,291,328.

BACKGROUND OF THE INVENTION

The present invention relates to an opto-electronic device and fabrication method thereof, more particularly to the alignment of a patterned ohmic contact layer in an opto-electronic device.

The ohmic contact layer in question interfaces between an electrode and a diffusion area on the surface of a semiconductor substrate, to ensure an ohmic contact between the electrode and the diffusion area. If the opto-electronic device is a light-emitting diode (LED), for example, the diffusion area is an area from which light is omitted when the electrode supplies driving current. If the device is an LED array, there are a plurality of such areas, with respective electrodes.

Especially in the case of an LED array, the ohmic contact pattern needs to be accurately aligned with the diffusion areas. This is difficult, because the diffusion areas are conventionally defined by a diffusion mask, and the ohmic contact layer is patterned by an etching mask. The two masks are formed in different steps in the fabrication process, and their mutual alignment is almost never perfect. Mask alignment error, and the resultant misalignment of the ohmic contact pattern with the diffusion pattern, can cause such problems as inadequate electrical contact between electrodes and diffusion areas, and short circuits between electrodes and non-diffusion areas. These problems are particularly acute in high-density arrays, where they significantly reduce manufacturing yields and degrade light-emitting characteristics.

LEDs and LED arrays are used as light sources for many purposes. To name one application, LED arrays are used as light sources in electrophotographic printers. The above-mentioned mentioned problems present an obstacle to the development of high-quality LED printers with high dot resolution.

SUMMARY OF THE INVENTION

An object of the present invention is to improve the manufacturing yields of opto-electronic devices having an ohmic contact layer.

Another object of the invention is to manufacture opto-electronic devices with uniform characteristics.

The invented method of fabricating an opto-electronic device comprises the steps of:

(a) forming an ohmic contact layer on the surface of a semiconductor substrate of a first conductive type;

(b) forming a diffusion source layer on the ohmic contact layer;

(c) forming a mask on the diffusion source layer;

(d) etching the diffusion source layer to form a pattern defined by the mask;

(e) diffusing impurity atoms from the diffusion source layer into the ohmic contact layer and the semiconductor substrate, forming a diffusion area of a second conductive type in the semiconductor substrate;

(f) etching the ohmic contact layer, using either the above mask or the diffusion source layer as an etching mask; and (g) forming an electrode making contact with the ohmic contact layer.

The diffusion step (e) may be performed either before or after the step (f) of etching the ohmic contact layer. When step (e) is performed before step (f), the diffusion source layer may be removed after step (f), and an isolation film deposited to isolate the electrode from the substrate. When step (e) is performed after step (f), a dielectric film, deposited between steps (e) and (f), may be used both as a diffusion cap film and as an inter-layer isolation film isolating the electrode from the substrate. An additional isolation film may be deposited on the dielectric film to improve the isolation.

The invention also provides opto-electronic devices fabricated by the method above.

In the invented fabrication method, since the ohmic contact layer is self-aligned with the diffusion source layer, it is also self-aligned with the diffusion area. Manufacturing yields are improved and uniform device characteristics are obtained because the ohmic contact layer is always aligned correctly with the diffusion area.

BRIEF DESCRIPTION OF THE DRAWINGS

In the attached drawings:

FIG. 5 is a plan view of another LED array embodying the invention;

DETAILED DESCRIPTION OF THE INVENTION

Figure 1:
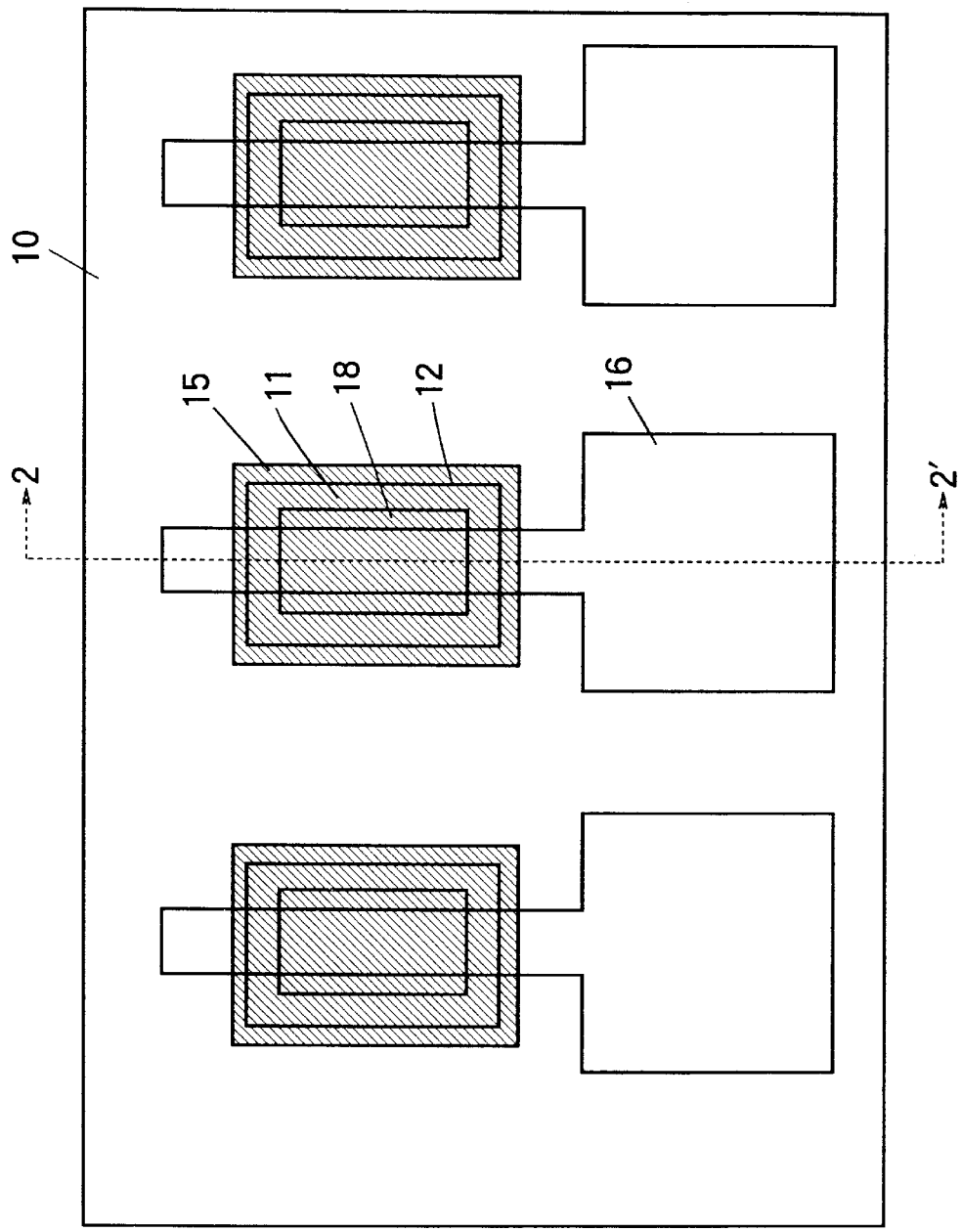
FIG. 1 is a plan view of an LED array embodying the invention.

Two embodiments of the invention will be described with reference to the attached drawings, in which like parts are indicated by like reference characters. The drawings are explanatory in nature; they are not drawn to scale, and do not attempt to show the exact sizes, shapes, or positional relationships of the constituent elements.

In both embodiments, the first conductive type is the n type and the second conductive type is the p type, but this relationship may be reversed; the first conductive type may be the p type, and the second conductive type may be the n type.

Both embodiments concern LED arrays of the homo junction type, but the invention can be practiced in devices of the single heterojunction or double heterojunction type, and the opto-electronic elements in these devices may be, for example, surface-emitting laser diodes or photosensitive diodes, instead of LEDs.

Figure 2:
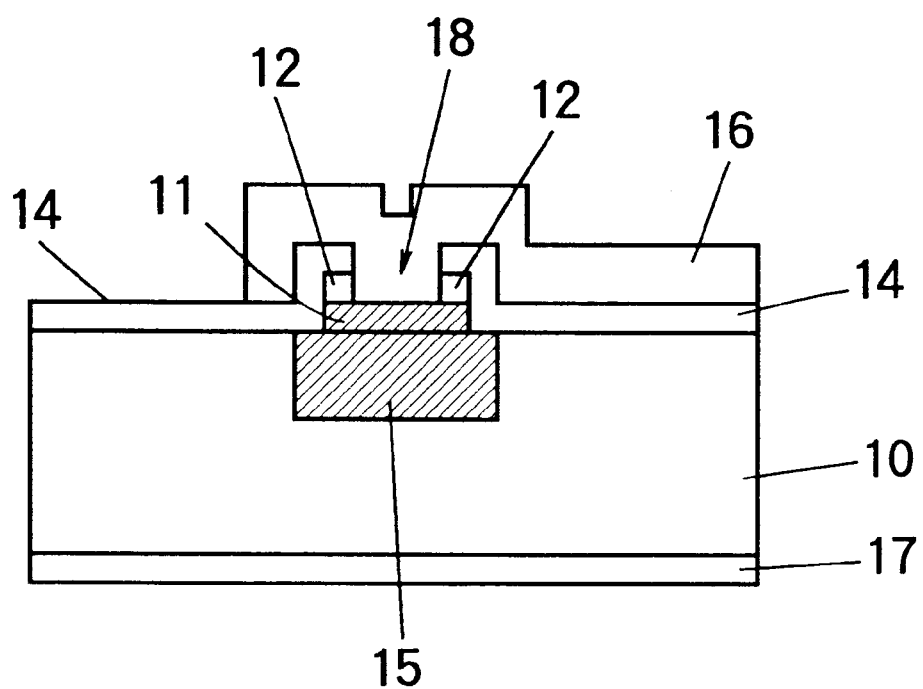
FIG. 2 is a sectional view through line 2—2' in FIG. 1.

The first embodiment is an array of LEDs as shown in FIGS. 1 and 2, and a method of fabricating the array.

Referring to the plan view in FIG. 1, the array comprises an n-type semiconductor substrate 10 with light-emitting areas (LEDs), which are indicated by hatching. For simplicity, an array of only three LEDs is shown, but the number of LEDs may of course be greater. An ohmic contact layer 11 is disposed on the surface of the substrate 10, forming a rectangle within each light-emitting area. A diffusion source layer 12 is disposed on the ohmic contact layer 11, forming a rectangular ring at the edge of each rectangle of the ohmic contact layer.

Referring to the sectional view in FIG. 2, the diffusion source layer 12 is covered by a diffusion cap film 14, which also covers the semiconductor substrate 10 exterior to the ohmic contact layer 11 and diffusion source layer 12. A diffusion area 15 is disposed in the semiconductor substrate 10 below the ohmic contact layer 11 in each light-emitting area, The diffusion area 15 extends a certain distance beyond the edges of the ohmic contact layer 11, and extends to a certain depth in the semiconductor substrate 10. The light-emitting area includes both the ohmic contact layer 11 and the diffusion area 15.

Each light-emitting area has a p-electrode 16, which extends down to the ohmic contact layer 11 through a contact hole 18 in the diffusion cap film 14 and diffusion source layer 12. The entire lower surface of the device is covered by an n-electrode 17. The current path from the p-electrode 16 to the n-electrode 17 passes through the ohmic contact layer 11, the diffusion area 15, and the body of the semiconductor substrate 10. When current flows, light is emitted by carrier recombination near the pn junction between the diffusion area 15 and semiconductor substrate 10.

One feature of the first embodiment is that the ohmic contact layer 11 is self-aligned with the diffusion source layer 12 and diffusion area 15, all of these elements being defined by the same mask during the fabrication process. Another feature is that the diffusion cap film 14, which prevents the escape of impurity atoms during a solid-phase diffusion step in the fabrication process, also functions as an inter-layer isolation film, electrically isolating the electrode pattern 16 from the semiconductor substrate 10 in the completed device.

The fabrication process is described next.

Figure 3A:
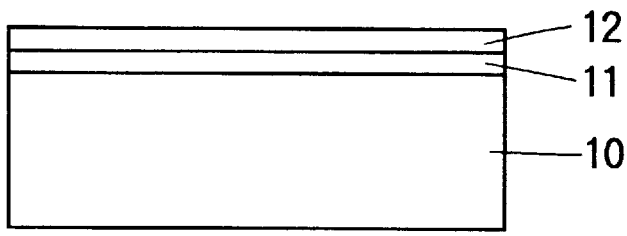
FIGS. 3A, 3B, 3C, 3D, 3E, 4A, 4B, 4C, and 4D are sectional views illustrating steps in a fabrication process for the LED array in FIGS. 1 and 2.

Referring to FIG. 3A, the fabrication process begins with the formation of an ohmic contact layer 11 and a diffusion source layer 12 on the entire surface of the semiconductor substrate 10. The semiconductor substrate 10 comprises, for example, n-type aluminum gallium arsenide (AlGaAs). The ohmic contact layer 11 comprises, for example, gallium arsenide (GaAs). The ohmic contact layer 11 is grown as an epitaxial layer on the substrate 10 by a technique such as metal-organic chemical vapor deposition (MOCVD) or molecular-beam epitaxy (MBE). The diffusion source layer 12 comprises, for example, a layer of zinc oxide (ZnO), which is sputtered onto the ohmic contact layer 11.

Figure 3B:
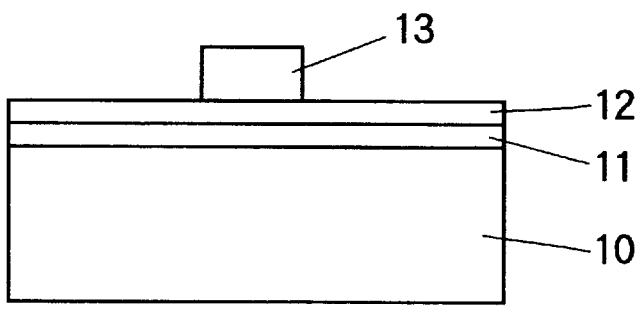
Figure 3C:
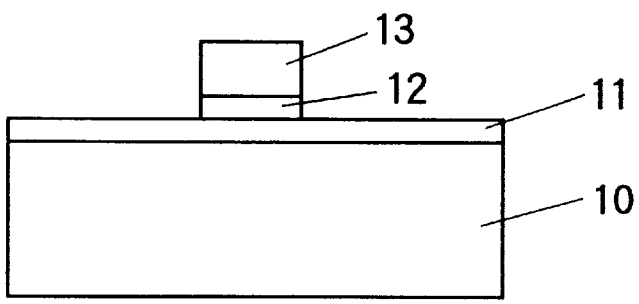
Figure 3D:
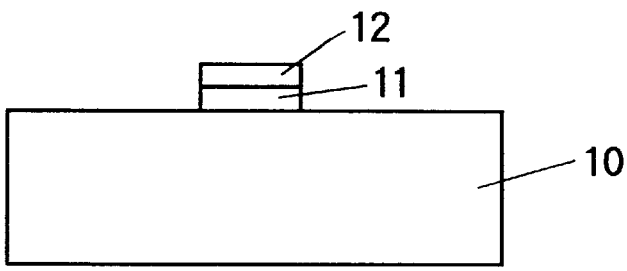

The ohmic contact layer 11 and diffusion source layer 12 are patterned by photolithography and etching. Referring to FIG. 3B, a photoresist pattern 13, defining what will become the light-emitting areas, is formed on the diffusion source layer 12. Referring to FIG. 3C, the diffusion source layer 12 is etched, using a wet etchant such as hydrofluoric acid (HF) or an HF solution, the photoresist pattern 13 functioning as an etching mask. All of the diffusion source layer 12 is removed except for rectangular islands left under the photoresist pattern 13. Next, referring to FIG. 3D, the ohmic contact layer 11 is etched, using a wet etchant such as phosphoric acid mixed with hydrogen peroxide, or citric acid mixed with hydrogen peroxide. The same photoresist pattern 13 is also used as an etching mask during the etching of the ohmic contact layer 11, so that the remaining islands of the ohmic contact layer 11 are self-aligned with the remaining islands of the diffusion source layer 12. After the etching of the ohmic contact layer 11, the photoresist pattern 13 is removed, by use of an organic solvent or the like.

In a variation of this process, the photoresist pattern 13 is removed after the diffusion source layer 12 has been etched, and the remaining portions of the diffusion source layer 12 are used as a mask for etching the ohmic contact layer 11. The ohmic contact layer 11 is also self-aligned with the diffusion source layer 12 in this variation.

Figure 3E:
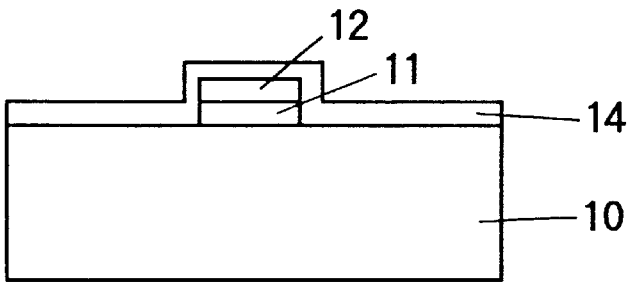

Referring to FIG. 3E, the entire surface of the device is now covered with a diffusion cap film 14. The diffusion cap film 14 is desirable because it improves the reliability of the solid-phase diffusion process that follows, and is necessary in the first embodiment because it provides electrical isolation in the completed device. The diffusion cap film 14 comprises a dielectric material such as silicon nitride or a dielectric compound of aluminum.

Figure 4A:
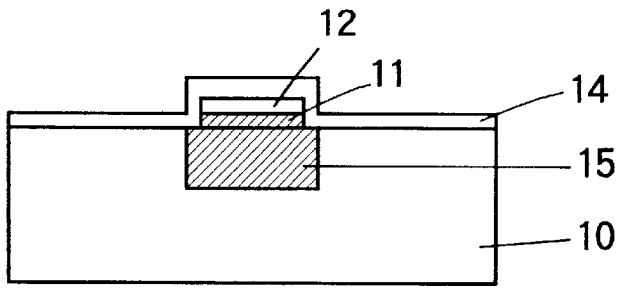

Referring to FIG. 4A, the diffusion process is carried out by heating the device, causing p-type impurity atoms (e.g., zinc atoms) to diffuse from the diffusion source layer 12 into the underlying ohmic contact layer 11 and the underlying part of the semiconductor substrate 10, forming the diffusion areas 15. If the semiconductor substrate 10 comprises n-type $Al_{0.15}Ga_{0.85}As$, the ohmic contact layer 11 comprises GaAs, and the diffusion source layer 12 comprises ZnO, diffusion areas 15 approximately one micrometer (1 $\mu$m) deep can be formed by heating the device to six hundred fifty degrees Celsius (650° C.) for three hours.

Figure 4B:
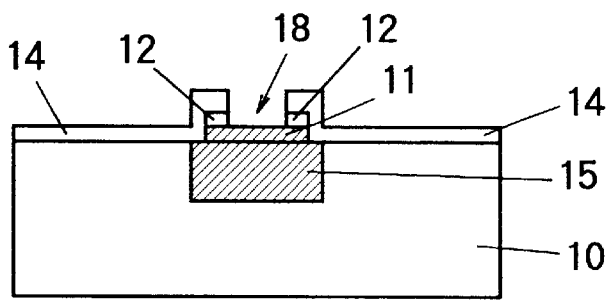

Referring to FIG. 4B, contact holes 18 are now created by photolithography and etching. Photolithography forms an etching mask (not shown) having a hole over each rectangle of the diffusion source layer 12. Etching extends the hole through the diffusion cap film 14 and diffusion source layer 12, down to the surface of the ohmic contact layer 11. Either wet or dry etching may be employed. Dry etching is suitable if the diffusion cap film 14 comprises silicon nitride. Wet etching, with hot phosphoric acid, for example, is suitable if the diffusion cap film 14 is an aluminum compound.

Figure 4C:
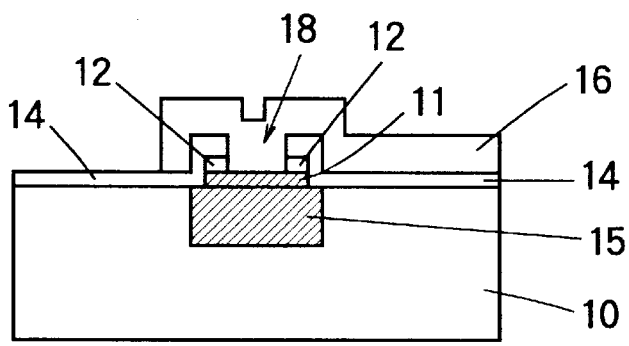

Referring to FIG. 4C, the p-electrode pattern is now created. First a film of a conductive material, such as aluminum, that forms an ohmic contact with the ohmic contact layer 11 is deposited on the entire surface of the device, filling the contact holes 18. Next, the film is patterned by photolithography and etching to leave a p-electrode 16 for each light-emitting area. Heat treatment is preferably carried out after the p-electrodes 16 have been formed, to improve the quality of the electrical contact between the ohmic contact layer 11 and p-electrodes 16.

Figure 4D:
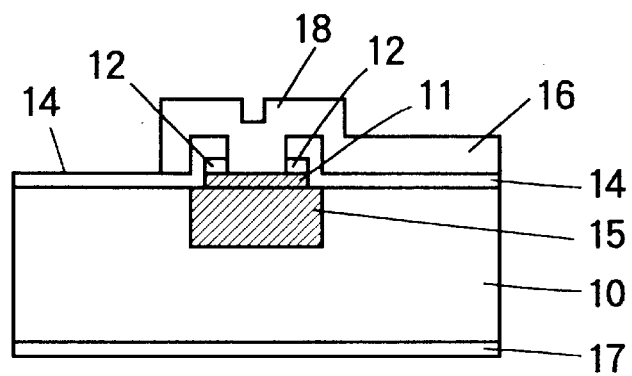

Referring to FIG. 4D, the underside of the semiconductor substrate 10 is polished, to improve the characteristics of the completed device, and the n-electrode 17 is deposited on the polished surface. The n-electrode 17 may comprise any conductive material capable of forming an ohmic contact with the semiconductor substrate 10. If the semiconductor substrate 10 comprises AlGaAs, for example, the n-electrode 17 may comprise a gold alloy.

In the completed device, the ohmic contact layer 11 is accurately aligned with each diffusion area 15, because the ohmic contact layer 11 is self-aligned with the diffusion source layer 12 from which the diffusion areas 15 are created. High manufacturing yields and uniform optical output are thus obtained, even in a high-density array. In addition, use of the diffusion cap film 14 for inter-layer isolation simplifies the fabrication process and reduces the cost of the device.

In a variation of the first embodiment, an additional inter-layer isolation film is deposited on the diffusion cap film 14 after the solid-phase diffusion process, either before or after the contact holes 18 are formed. If the additional isolation film is deposited before the contact holes 18 are formed, the contact holes can be formed in one photolithography and etching process, but the additional depth of the contact holes may cause more devices to be rejected due to electrical discontinuities. If the additional isolation film is deposited after the contact holes 18 are formed, a second photolithography and etching process is needed to bring the contact holes out through the additional isolation film, but the holes in the additional isolation film can be enlarged to reduce the occurrence of electrical discontinuities.

The second embodiment is an array of LEDs as shown in FIG. 5, and a method of fabricating the array. The second embodiment differs from the first embodiment in that the diffusion source layer and diffusion cap film are removed during the fabrication process.

Figure 6:
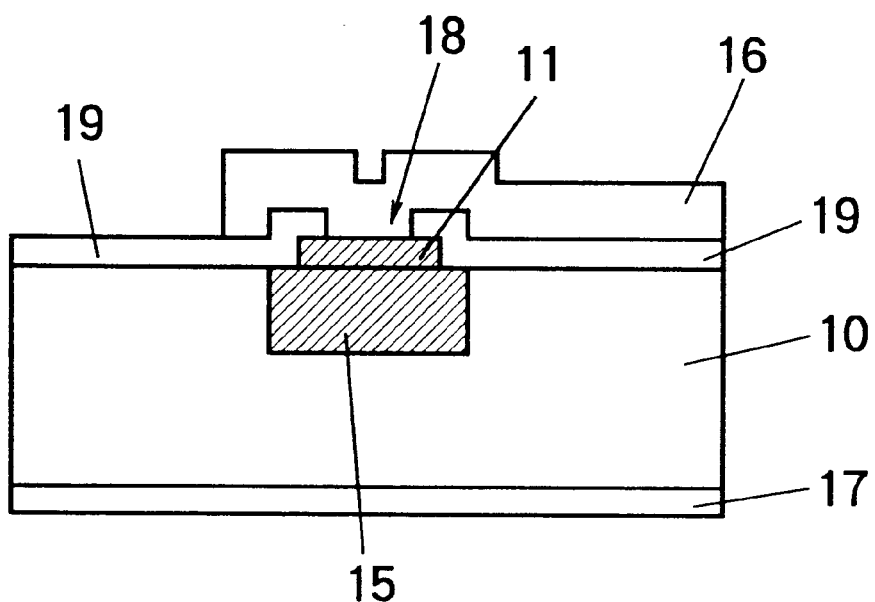
FIG. 6 is a sectional view through line 6—6' in FIG. 5.

Referring to FIG. 6, the semiconductor substrate 10, ohmic contact layer 11, diffusion area 15, p-electrode pattern 16, n-electrode 17, and contact holes 18 are generally as described in the first embodiment, but the diffusion source layer and diffusion cap film of the first embodiment are replaced by an inter-layer isolation film 19 in the completed device. The contact holes 18 extend through the inter-layer isolation film 19 down to the surface of the ohmic contact layer 11.

Figure 7A:
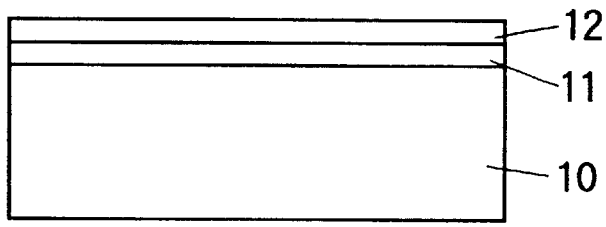
FIGS. 7A, 7B, 7C, 7D, 7E, 8A, 8B, 8C, 8D, 8E, 9A, 9B, and 9C are sectional views illustrating steps in a fabrication process for the LED array in FIGS. 5 and 6.

Referring to FIG. 7A, the fabrication process in the second embodiment begins, as in the first embodiment, with the growth of an epitaxial ohmic contact layer 11 on the semiconductor substrate 10, and the deposition of a diffusion source layer 12. The same materials and processes can employed as in the first embodiment, e.g., AlGaAs for the semiconductor substrate 10, GaAs grown epitaxially by MOCVD or MBE for the ohmic contact layer 11, and sputtered ZnO for the diffusion source layer 12.

Figure 7B:
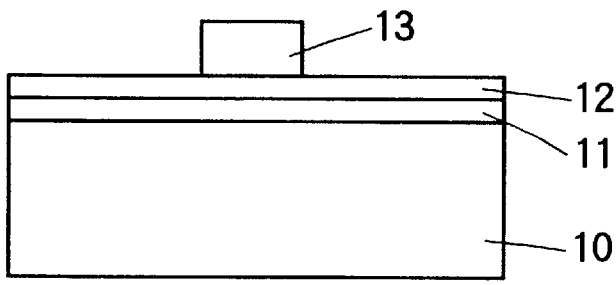

Referring to FIG. 7B, a photoresist pattern 13 is formed by photolithography as in the first embodiment.

Figure 7C:
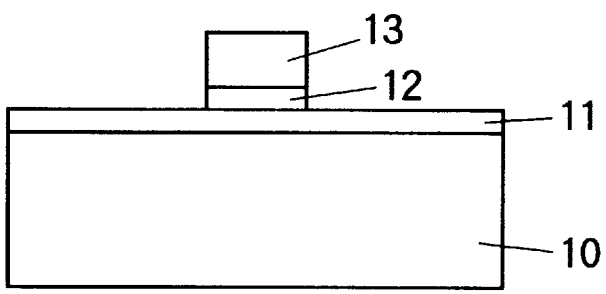

Referring to FIG. 7C, the diffusion source layer 12 is etched as in the first embodiment, using the photoresist pattern 13 as an etching mask, leaving rectangular islands.

Figure 7D:
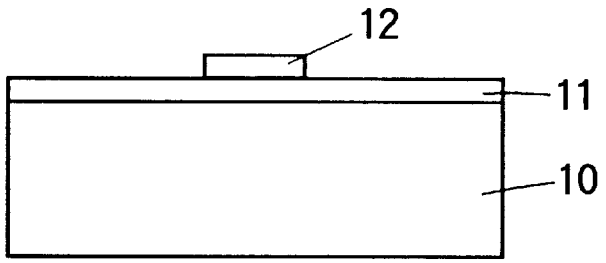

Referring to FIG. 7D, the photoresist pattern 13 is now removed, by use of an organic solvent, for example.

Figure 7E:
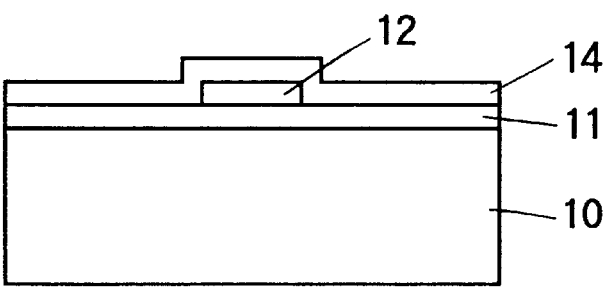

Referring to FIG. 7E, a diffusion cap film 14 is deposited on the entire surface of the device. The diffusion cap film 14 may comprise silicon nitride or a dielectric compound of aluminum, as in the first embodiment. The diffusion cap film 14 is not essential, but is desirable because it improves the reliability of the solid-phase diffusion process.

Figure 8A:
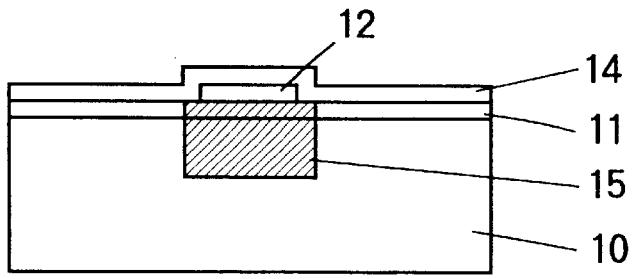

Referring to FIG. 8A, solid-phase diffusion is carried out by heating the device, forming the diffusion areas 15. As in the first embodiment, if the semiconductor substrate 10 comprises n-type $Al_{0.15}Ga_{0.85}As$, the ohmic contact layer 11 comprises GaAs, and the diffusion source layer 12 comprises ZnO, diffusion areas 15 approximately one micrometer deep can be formed by heating the device to 650° C. for three hours. Impurity atoms diffuse into the ohmic contact layer 11 and semiconductor substrate 10 in an area somewhat larger than area directly under the diffusion source layer 12.

Figure 8B:
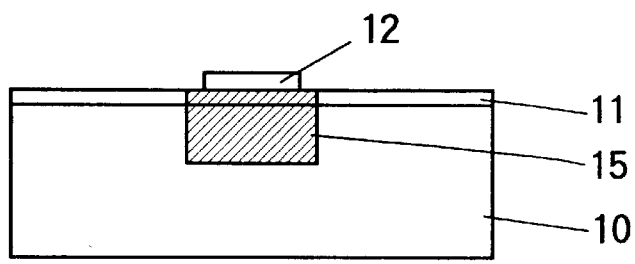

Referring to FIG. 8B, the diffusion cap film 14 is now removed by etching. If the diffusion cap film 14 comprises silicon nitride, dry etching can be employed, with a mixture of carbon tetrafluoride and oxygen gases ($CF_4+O_2$) as the etchant. If the diffusion cap film 14 comprises an aluminum compound, wet etching with hot phosphoric acid can be employed.

Figure 8C:
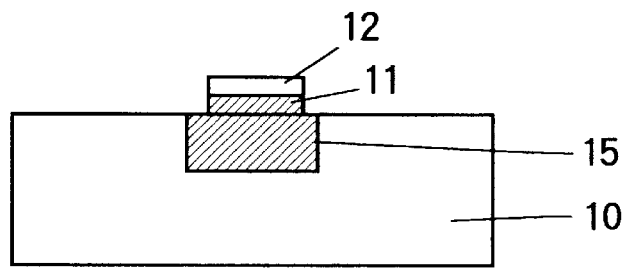

Referring to FIG. 8C, the ohmic contact layer 11 is patterned by etching, using the diffusion source layer 12 as an etching mask. Wet etching can be employed, using phosphoric acid mixed with hydrogen peroxide or citric acid mixed with hydrogen peroxide as the etchant. This etching step reduces the ohmic contact layer 11 to rectangular islands disposed directly below the rectangular islands of the diffusion source layer 12. The rectangles of the ohmic contact layer 11 are self-aligned both with the rectangles of the diffusion source layer 12 and with the diffusion areas 15 formed from the diffusion source layer 12. Since the diffusion areas 15 are larger than the rectangular islands of the diffusion source layer 12, the ohmic contact layer 11 is reliably confined within the bounds of the diffusion areas 15.

Figure 8D:
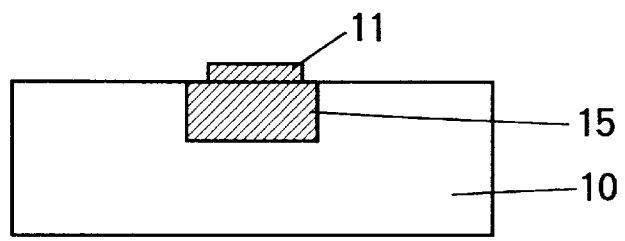

Referring to FIG. 8D, the diffusion source layer 12 is removed by etching. Wet etching with an etchant including hydrofluoric acid can be employed.

Figure 8E:
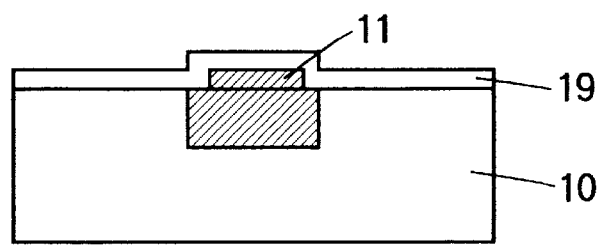

Referring to FIG. 8E, an inter-layer isolation film 19 is now deposited on the entire surface of the device. The inter-layer isolation film 19 comprises a transparent dielectric material such as silicon nitride, aluminum oxide ($Al_2O_3$), or another dielectric compound of aluminum. A silicon-nitride film can be deposited by chemical vapor deposition (CVD). An aluminum-oxide film can be deposited by sputtering.

Figure 9A:
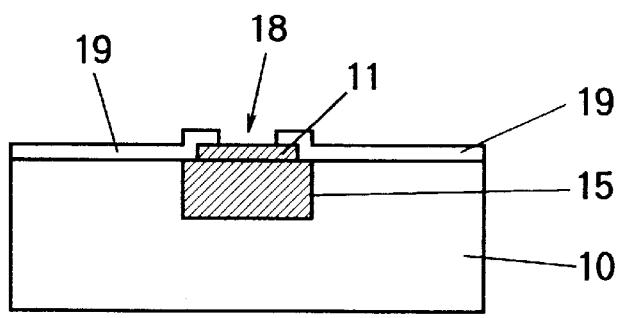

Referring to FIG. 9A, contact holes 18 are created by photolithography and etching, essentially as in the first embodiment. Each contact hole 18 extends through the inter-layer isolation film 19 down to the surface of the ohmic contact layer 11. Dry etching may be employed if the inter-layer isolation film 19 comprises silicon nitride. Wet etching, with hot phosphoric acid, for example, is suitable if the inter-layer isolation film 19 is an aluminum compound.

Figure 9B:
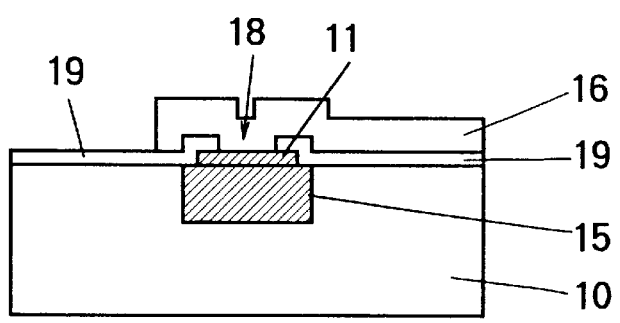

Referring to FIG. 9B, the p-electrodes 16 are now created by deposition, photolithography, and etching of a conductive film, such as an aluminum film, as in the first embodiment. Heat treatment is preferably carried out after the electrode pattern has been formed, to improve the electrical contact between the ohmic contact layer 11 and p-electrodes 16.

Figure 9C:
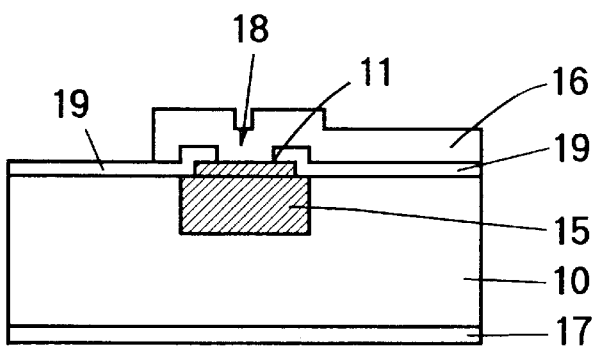

Referring to FIG. 9C, the underside of the semiconductor substrate 10 is polished, and the n-electrode 17 is formed as in the first embodiment.

In the completed device, as explained above, the ohmic contact layer 11 is accurately aligned with the diffusion areas 15, so high manufacturing yields and uniform optical output are obtained. Compared with the first embodiment, the contact holes 18 are shallower, because they pass through only one layer. Furthermore, the surface of the inter-layer isolation film 19 in the second embodiment is more nearly flat than the surface of the diffusion cap film 14 in the first embodiment, because the diffusion source layer 12 is removed. For both of these reasons, the probability of electrical discontinuities in the p-electrodes 16 is reduced. In addition, the inter-layer isolation film 19 can be designed to provide better electrical isolation than is provided by the diffusion cap film 14 in the first embodiment, reducing the probability of short circuits between the p-electrodes 16 and the n-type semiconductor substrate 10. Higher manufacturing yields can thus be expected in the second embodiment than in the first embodiment, despite the longer fabrication process.

The LED arrays described in the first and second embodiments are useful as a light sources in electrophotographic printers. High dot resolution and highly uniform printing can be attained with these LED arrays.

For comparison, a conventional LED array and its fabrication process will now be described.

Figure 10:
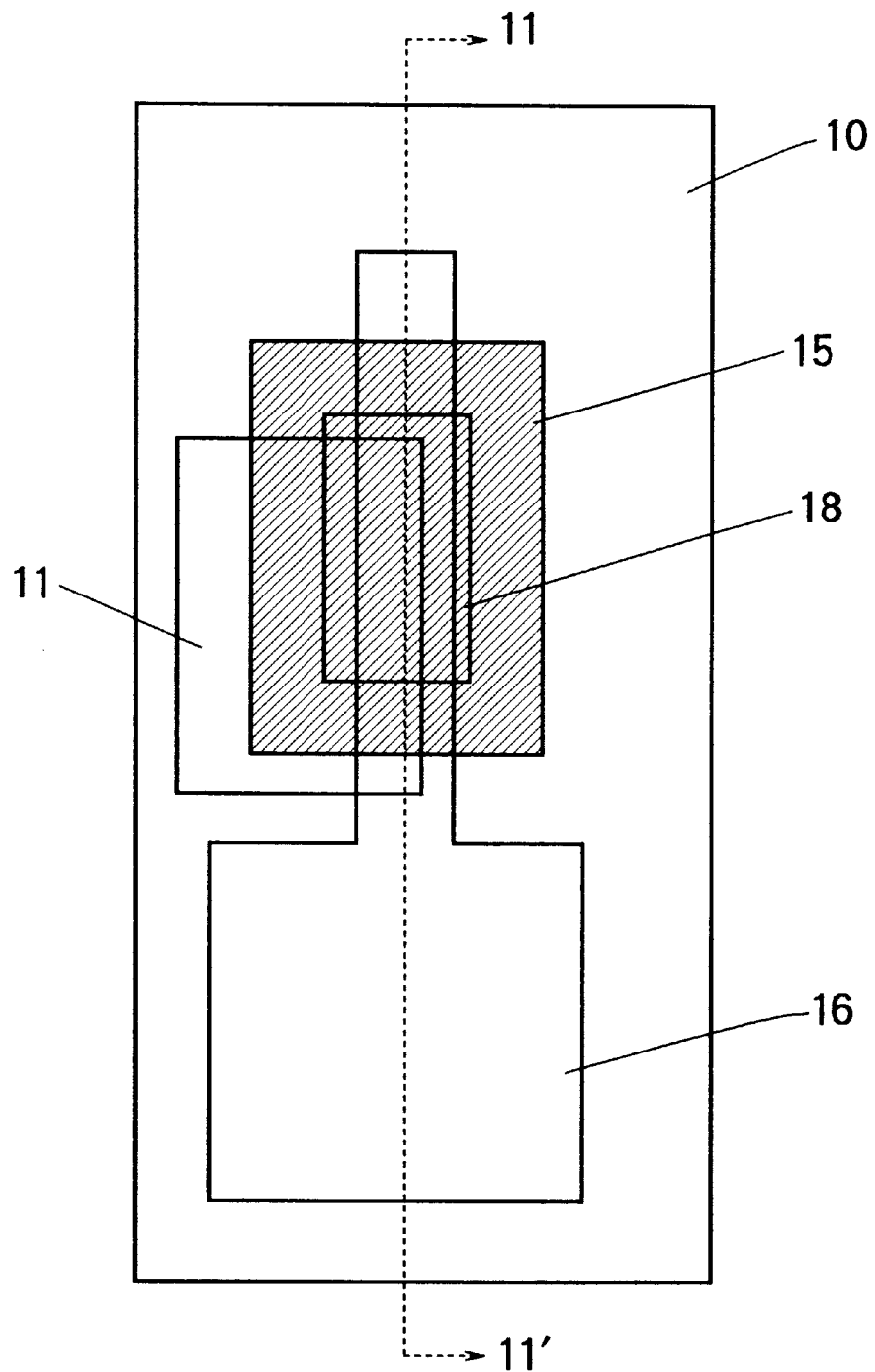
FIG. 10 is a plan view of a conventional LED array.

Referring to FIG. 10, the conventional LED array comprises an n-type semiconductor substrate 10 in which p-type diffusion areas 15 are formed. For simplicity, only one diffusion area 15 is shown. Current is supplied to the diffusion areas 15 from p-electrodes 16 through contact holes 18. An ohmic contact layer 11 is provided, but the ohmic contact layer 11 is not self-aligned with the diffusion areas 15, and may be displaced, as shown, due to mask alignment error.

Figure 11:
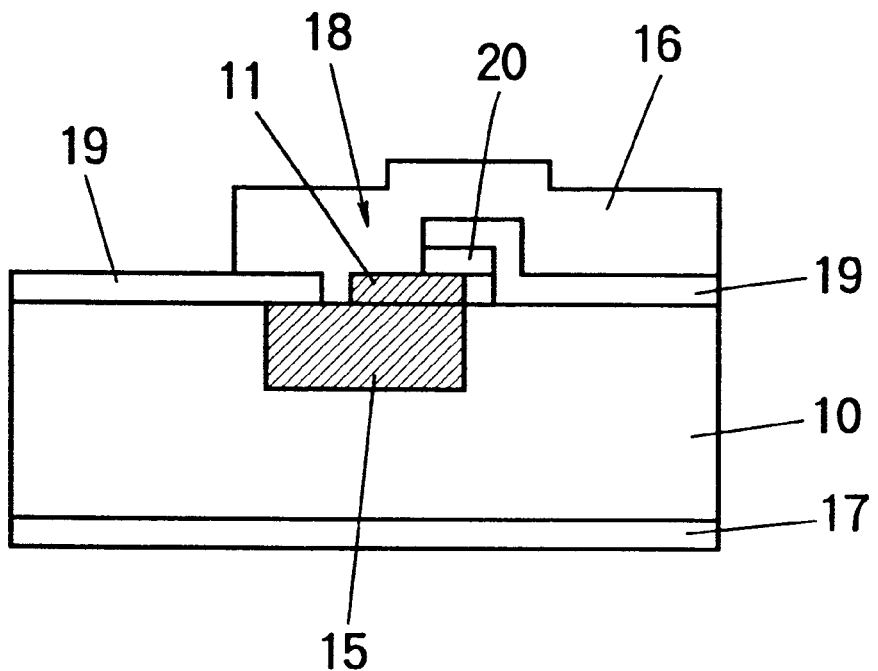
FIG. 11 is a sectional view through line 11—11' in FIG. 10.

Referring to FIG. 11, the semiconductor substrate 10 is covered by an inter-layer isolation film 19, in which the contact holes 18 are formed. The ohmic contact layer 11 ideally comprises rectangular islands centered below the contact holes 18, but due to mask alignment error, the centering is rarely perfect. When there is large alignment error, part of a p-electrode 16 may make direct contact with the surface of a diffusion area 15, as shown. Alignment error may also cause part of a diffusion mask 20 to be left between the ohmic contact layer 11 and the inter-layer isolation film 19, creating undesired surface irregularities in the inter-layer isolation film 19. For example, the perimeter of a contact hole 18 may have an uneven height, as shown.

An n-electrode 17 is formed on the underside of the device, as in the above embodiments of the invention.

Figure 12A:
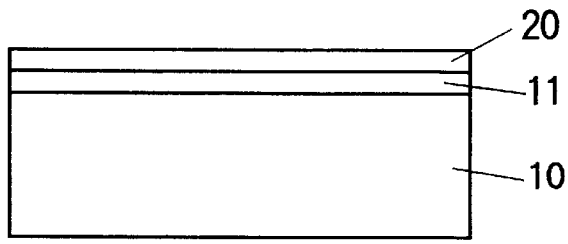
FIGS. 12A, 12B, 12C, 12D, 12E, 13A, 13B, 13C, 13D, 13E, 14A, 14B, and 14C are sectional views illustrating steps in a fabrication process for the LED array in FIGS. 10 and 11.

Referring to FIG. 12A, the fabrication process for the conventional LED array begins with the formation of an ohmic contact layer 11 and a diffusion mask layer 20 on the entire surface of the semiconductor substrate 10. The semiconductor substrate 10 may comprise AlGaAs and the ohmic contact layer 11 may comprise GaAs, as in the preceding embodiments. The diffusion mask layer 20 comprises, for example, silicon nitride or aluminum oxide.

Figure 12B:
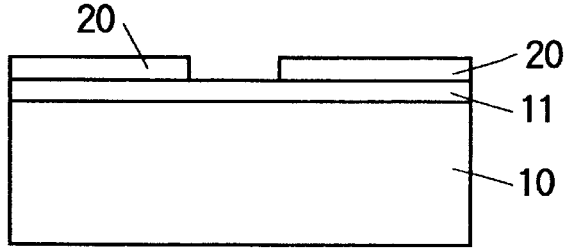

Referring to FIG. 12B, the diffusion mask layer 20 is patterned by photolithography and etching to open windows that will define the diffusion areas. The etching mask (a photoresist pattern, not shown) is removed after the etching process.

Figure 12C:
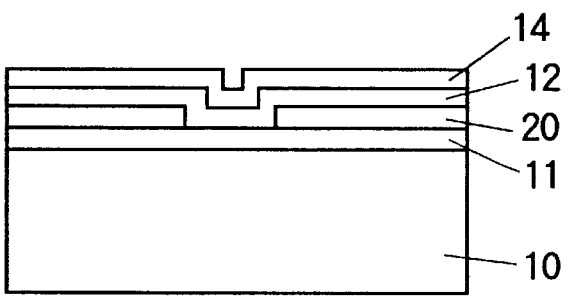

Referring to FIG. 12C, a diffusion source layer 12 and a diffusion cap film 14 are deposited on the diffusion mask 20, and on the ohmic contact layer 11 exposed in the windows of the diffusion mask. The diffusion cap film 14 comprises, for example, silicon nitride or aluminum oxide.

Figure 12D:
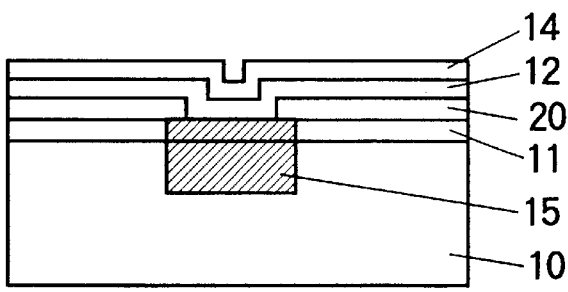
Figure 12E:
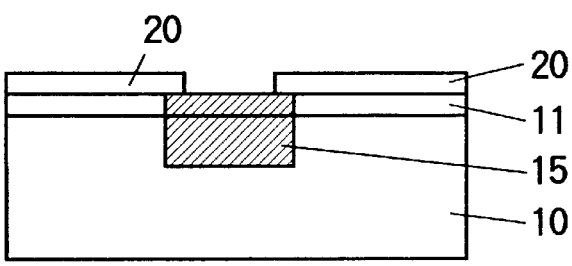

Referring to FIG. 12D, solid-phase diffusion is performed, causing impurity atoms to diffuse from the diffusion source layer 12 through the windows of the diffusion mask 20 into the ohmic contact layer 11 and semiconductor substrate 10, creating the diffusion areas 15. The diffusion source layer 12 and diffusion cap film 14 are then removed as shown in FIG. 12E.

Figure 13A:
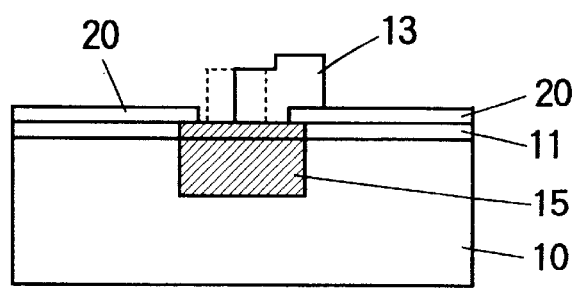

Referring to FIG. 13A, an etching mask 13 is formed by photolithography. Ideally, the mask pattern is confined to areas within the windows in the diffusion mask 20, as indicated by the dotted line, but aligning the etching mask 13 with these windows is difficult, and the etching mask may extend outside the windows, as shown.

Figure 13B:
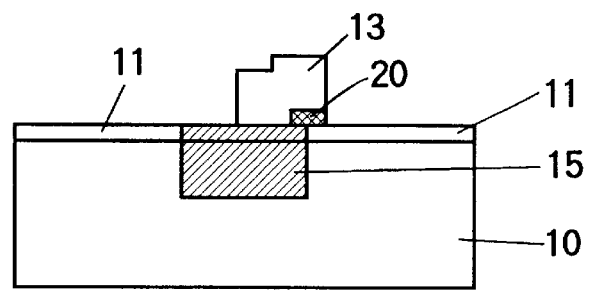

Referring to FIG. 13B, the diffusion mask 20 is etched, removing the part not covered by the etching mask 13. If the two masks 13, 20 are not correctly aligned with each other, an unintended part of the diffusion mask may be left unetched, as shown.

Figure 13C:
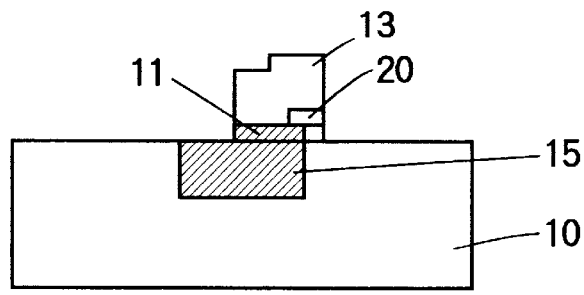
Figure 13D:
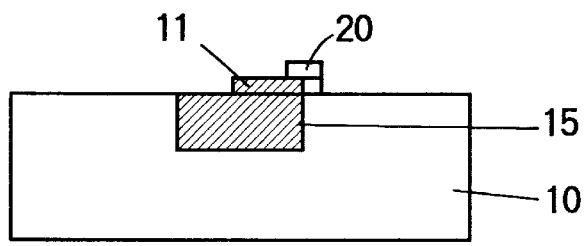

Referring to FIG. 13C, the ohmic contact layer 11 is also etched, removing the part not covered by the etching mask 13. If the etching mask 13 is misaligned, too much of the ohmic contact layer 11 may be removed from over the diffusion areas 15, and part of the ohmic contact layer 11 outside the diffusion areas 15 may fail to be removed, as shown. After this etching step, the etching mask 13 is removed as indicated in FIG. 13D.

Figure 13E:
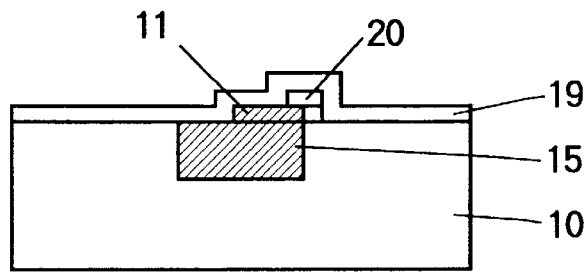

Referring to FIG. 13E, the inter-layer isolation film 19 is deposited on the entire surface of the device.

Figure 14A:
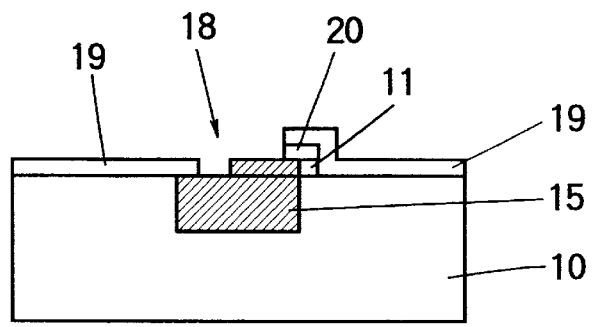

Referring to FIG. 14A, contact holes 18 are formed in the inter-layer isolation film 19 by photolithography and etching. Even if a contact hole 18 is accurately positioned over a diffusion area 15, however, it is not necessarily positioned accurately over the ohmic contact layer 11, as shown.

Figure 14B:
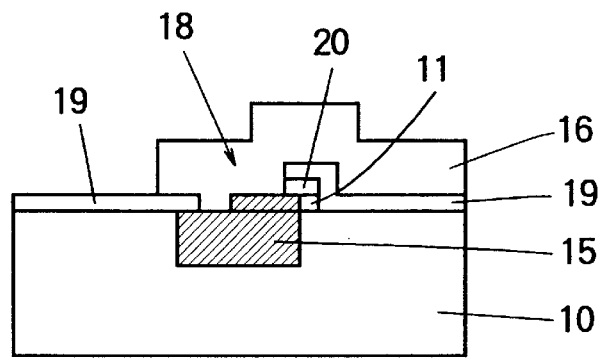

Referring to FIG. 14B, the p-electrode pattern 16 is formed by conductive-film deposition, photolithography, and etching. The p-electrodes 16 extend through the contact holes 18 and make contact with the ohmic contact layer 11, but due to inaccurate alignment of the ohmic contact layer 11, they may also make direct contact with the diffusion areas 15, as shown. The electrical resistance in these direct-contact areas is higher than in the areas where the ohmic contact layer 11 is present, so one consequence of the alignment error may be inadequate flow of current into the diffusion areas 15. Another consequence may be the flow of current directly from the ohmic contact layer 11 into the n-type semiconductor substrate 10, bypassing the pn junction between the semiconductor substrate 10 and diffusion areas 15. Both of these consequences lead to reduced emission of light from the diffusion areas 15.

Figure 14C:
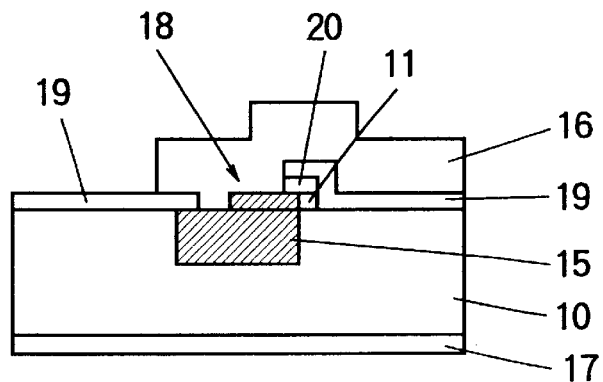

Referring to FIG. 14C, the final step is the formation of the n-electrode 17.

By using a self-aligned ohmic contact layer, the present invention eliminates the alignment problems illustrated in the conventional LED array, and enables the fabrication of LED arrays and other opto-electronic devices with highly uniform characteristics.

Self-alignment of the ohmic contact layer also reduces the number of photolithography steps in the fabrication process, since the same mask defines both the ohmic contact layer and the diffusion areas.

By employing the diffusion cap film as an inter-layer isolation film, the first embodiment provides a relatively short and simple fabrication process. If necessary, inter-layer isolation can be improved by the provision of an additional isolation film.

By removing the diffusion cap film and diffusion source layer, the second embodiment provides a device with a flatter surface and reduces the likelihood of electrical discontinuities.

The invention has been described in relation to an LED array, but similar effects can be obtained in other opto-electronic devices. The invention can be practiced in any type of opto-electronic device that has diffusion areas that can be formed by solid-phase diffusion, and that uses an ohmic contact layer to assure ohmic contact between these diffusion areas and an electrode pattern.

A few variations have been noted in the embodiments above, but those skilled in the art will recognize that further variations are possible within the scope claimed below.

What is claimed is:

1. An opto-electronic device having a semiconductor substrate of a first conductive type, with at least one diffusion area of a second conductive type formed in the semiconductor substrate, comprising:

an ohmic contact layer disposed on a surface of the semiconductor substrate within said at least one diffusion area, self-aligned with and smaller than said at least one diffusion area;

a diffusion source layer disposed on the ohmic contact layer, self-aligned with and equal in area to the ohmic contact layer, the diffusion source layer being penetrated by at least one contact hole extending to the ohmic contact layer;

a diffusion cap film disposed on the diffusion source layer and said surface of the semiconductor substrate, said at least one contact hole also penetrating the diffusion cap film; and at least one electrode disposed on the diffusion cap film, electrically isolated from the semiconductor substrate by the diffusion cap film, making electrical contact with the ohmic contact layer through said at least one contact hole.

2. The opto-electronic device of claim 1, wherein said at least one diffusion area constitutes a light-emitting area.

3. The opto-electronic device of claim 1, further comprising a second electrode making electrical contact with the semiconductor substrate of the first conductive type outside said at least one diffusion area.

* * * * *